United States Patent [19]

Perchak

[11] 4,402,185

[45] Sep. 6, 1983

[54] THERMOELECTRIC (PELTIER EFFECT) HOT/COLD SOCKET FOR PACKAGED I.C. MICROPROBING

[75] Inventor: Robert M. Perchak, Dayton, Ohio

[73] Assignee: NCR Corporation, Dayton, Ohio

[21] Appl. No.: 337,786

[22] Filed: Jan. 7, 1982

[51] Int. Cl.³ ............................................. F25B 21/02
[52] U.S. Cl. ........................................................ 62/3
[58] Field of Search ............................................. 62/3

[56] References Cited

U.S. PATENT DOCUMENTS 3,136,134  6/1964  Smith .
3,314,242  4/1967  Lefferts .
4,007,061  2/1977  Le Couturier .
4,253,515  3/1981  Swiatosz .

OTHER PUBLICATIONS

D. A. Zeskind, "Thermoelectric Heat Pumps Cool Packages Electronically," Electronics, Jul. 31, 1980, pp. 109–113.

Primary Examiner—Lloyd L. King
Attorney, Agent, or Firm—J. T. Cavender; Philip A. Dalton; T. Rao Coca

[57] ABSTRACT

Disclosed is a two-stage thermoelectric heat pumping apparatus for heating/cooling an I.C. chip. The first stage is a primary thermoelectric module sandwiched between a base made of a high thermal conductivity material and functioning as a heat source/sink and a heat conductive pad. The second stage is a secondary thermoelectric module sandwiched between the pad and a heat conductive block designed to receive a slotted I.C. chip socket at the top portion thereof and provided with a contact surface such that, upon insertion into the socket, the chip is in direct contact with said contact surface. By passing suitable currents through all the thermoelectric modules heat is pumped, in the heating mode, from the base (source) to the chip and, in the cooling mode, from the chip to the base (sink).

6 Claims, 2 Drawing Figures

THERMOELECTRIC (PELTIER EFFECT) HOT/COLD SOCKET FOR PACKAGED I.C. MICROPROBING

BACKGROUND OF THE INVENTION

The invention relates to a portable apparatus for failure analysis or temperature characterization of packaged integrated circuit (I.C.) chips used in the semiconductor industry.

Failure analysis, which is a post-mortem examination of failed I.C. chips to determine the causes of failure, is an important procedure in semiconductor manufacturing. By using failure analysis, corrective actions may be taken in production processing, device design, test or application to eliminate the cause or prevent recurrence of the failure reported. Failure analysis typically consists of inserting a decapped I.C. chip into a test socket, subjecting the chip to extreme temperatures (in the range of about $-60°$ C. to $+150°$ C.) and performing electrical tests to determine (1) whether opens, shorts or abnormal characteristics exist between pairs of pins, pins and die or substrate, or pins and device package, (2) the threshold voltages of transistors, clock signals, and (3), in general, the operating characteristics of the I.C. chip. Testing is accomplished, typically, at an analytical probing test station with the aid of in-circuit probing equipment such as a micromanipulator which allows visual inspection of the individual circuits on a chip under high magnification (of up to 2000X) and probing of the circuits by means of tungsten probe tips.

Closely related to failure analysis is temperature characterization of the I.C. chip. This is an electrical verification procedure by which a newly designed chip, immediately after fabrication, is subjected to extremes of temperature to insure that the chip meets all the required electrical parameters.

Heating the I.C. chips to temperatures suitable for the above purposes was frequently accomplished in the prior art, by contacting the decapped I.C. chip with a resistance heater. By this technique, although the chip under test can be heated quickly, it takes an unduly long time to cool the chip thereby making failure analysis of each individual chip time-consuming and costly, particularly in a high-volume production environment.

A conventional method of cooling the I.C. chip to temperatures suitable for the above purposes is by mounting the I.C. chip to be tested in an expansion chamber and passing a liquified gas such as liquid carbon dioxide into the chamber. Due to absorption of heat from the chamber, the liquified gas vaporizes, thereby cooling the chip. Such processes, however, create vibrations of the I.C. chip and cause condensation of water vapor on the chip, both of which impair microprobing of the microcircuits on the I.C. chip.

Another conventional method of cooling I.C. chips is by contacting the chip with a chuck which is cooled by a refrigeration unit consisting of one or more heat exchangers using a refrigerant. This mode of cooling, thus, requires cumbersome and bulky refrigeration units.

In addition to these disadvantages of the prior art processes, there does not exist a simple, inexpensive, reliable and portable (i.e., small size and weight) apparatus which has the dual feature of rapidly heating and cooling the I.C. chip to the worst extremes of temperature.

Another prior art method of cooling/heating wafers and electronic components, rather than I.C. chips per se, is by means of a solid state thermoelectric module using the Peltier effect. The thermoelectric module consists of a number of Peltier couples, formed by joining p-doped and n-doped semiconductor elements, connected electrically in series and thermally in parallel by means of copper connecting strips. The couples are embedded between ceramic faceplates to electrically insulate the connecting strips from external surfaces. Passage of an electrical current through the module heats all Peltier couple junctions attached to one faceplate and cools all the junctions attached to the other faceplate thereby pumping heat from one faceplate to the other. One prior art method which uses the thermoelectric modules to cool an integrated circuit on a printed circuit board is illustrated in the publication by D. A. Zeskind entitled "Thermoelectric Heat Pumps Cool Packages Electronically," Electronics, July 31, 1980, pages 104–113.

SUMMARY OF THE INVENTION

It is an object of this invention to provide a cost-efficient, simple, reliable, and portable apparatus capable of rapidly heating, cooling and stabilizing an I.C. chip during temperature characterization and failure analysis.

It is another object of this invention to provide such an apparatus which is free from vibrations during temperature characterization and failure analysis of the chip.

These and other objects are achieved in a two-stage heat pumping apparatus comprised, in a preferred embodiment, of a thermal source/sink having a cavity. Arranged inside the cavity, sequentially, are a pair of solid state thermoelectric modules, a heat conductive pad, a third thermo-electric module and a heat conductive block. The heat conductive block is specially designed to receive, at the top portion thereof, an I.C. chip socket such that the chip, when inserted in the socket, makes direct contact with a contact area on the upper surface of said top portion. By passing a D.C. current in the one direction through all the modules heat is pumped from the thermal source to the chip, thereby heating the chip to a desired temperature. By reversing the current in all the modules heat is pumped from the chip to the thermal sink, thereby cooling the chip to a desired temperature. The pair of thermoelectric modules sandwiched between the pad and the thermal source/sink constitutes the first stage of the heat pump and actively pumps heat from/to the source/sink to/from the pad. The thermoelectric module sandwiched between the thermal block and the heat conductive pad constitutes the second stage of the heat-pumping action and actively pumps heat to/from the I.C. chip from/to the pad via the block. The cavity is fitted with a bottom plate having a central slot to pass therethrough the top portion of the block and effectively insulate all the modules from stray convective currents. A cavity cover plate, also slotted like the bottom plate to permit insertion/removal of the chip into/from the socket, forms an enclosed space surrounding the socket. The thermal source/sink is provided with a gas inlet to force dry gaseous nitrogen in the enclosed space around the socket preventing condensation of water vapor on the chip during the cooling operation.

BRIEF DESCRIPTION OF THE DRAWINGS

The above and other objects and advantages of this invention will become apparent from the following description when read in conjunction with the drawings wherein.

DETAILED DESCRIPTION OF A PREFERRED EMBODIMENT

Figure 1:
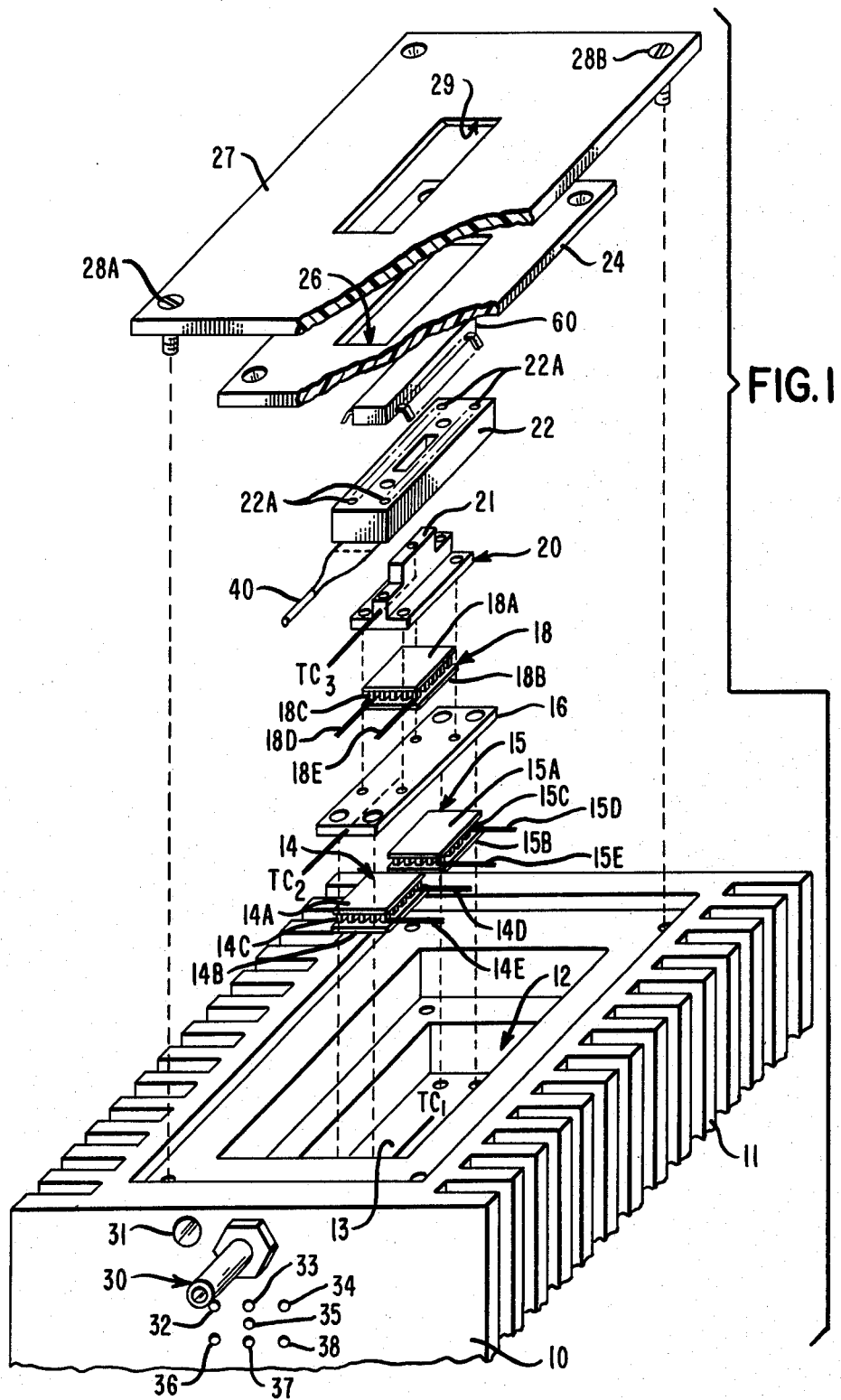
FIG. 1 is an exploded perspective view of the various components which together constitute the apparatus of the present invention.
Figure 2:
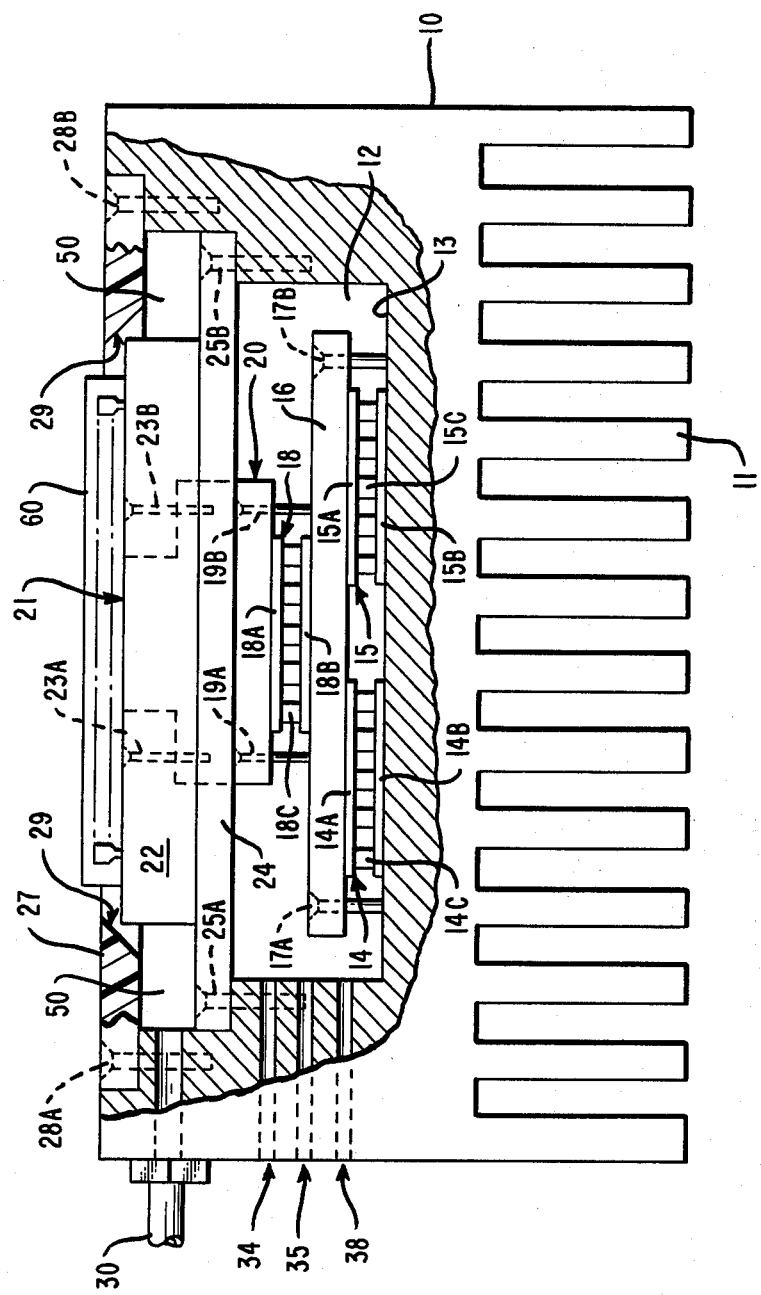
FIG. 2 is a schematic illustration of the assembled apparatus of this invention.

Turning now to FIGS. 1 and 2 of the drawings, the apparatus of the present invention comprises a thermal block 10 constructed of a high thermal conductivity material such as aluminum, which is easily machinable, inexpensive and durable. In the embodiment shown, the external dimensions of the thermal block 10 are about $15 \times 13 \times 9$ cms. Thermal block 10 serves as a heat sink during the cooling operation and a heat source during the heating operation of an I.C. chip 60. During the heating operation, the block 10 will absorb heat from the ambient air which is then transferred to the chip. During the cooling operation, the thermal block 10 will absorb heat from the chip. In order to maximize heat transfer to/from the environment, the thermal block 10 is provided with a number of vertical flanges 11 made in the walls of the block 10 creating a finned structure as shown in FIG. 1. The flanges 11 increase the surface area of the block 10, thereby enhancing convection and radiation of heat to the surrounding environment during the cooling operation and absorption of heat from the ambient during the heating operation of the chip.

The thermal block 10 has a rectangular cavity 12, illustratively, of dimensions $6 \times 9$ cms. and a flat floor 13. Embedded at the center of floor 13 is a thermocouple $TC_1$ for measuring the temperature of block 10. Arranged flush against the cavity floor 13 are a pair of commercially available thermoelectric modules 14 and 15. The thermoelectric modules 14 and 15 each have a pair of upper and lower ceramic faceplates 14A and 14B and 15A and 15B, respectively, constructed of a metallized ceramic material having a high electrical insulation and thermal conduction. Embedded between the faceplates 14A and 14B of thermoelectric module 14 and between faceplates 15A and 15B of thermoelectric module 15 are a number of Peltier couples 14C and 15C, respectively, which are connected electrically in series and thermally in parallel. When a low voltage of up to about 8 volts is applied to the thermoelectric modules 14 or 15, by connecting the wires 14D and 14E of module 14 and wires 15D and 15E of module 15 to a suitable power source, causing a current flow of about 1-15 amps therein, these modules, due to Peltier effect, behave like a heat pump by absorbing heat from one end (top or bottom) of the module and rejecting heat at the other end. Reversing the current in modules 14 and 15 reverses the direction of heat flow. In the embodiment shown in FIGS. 1 and 2, the modules 14 and 15 have the approximate dimensions $3 \times 3 \times 0.4$ centimeters and are sold as Part No. CP 1.4-71-06L by Material Electronic Products Corporation, Trenton, N.J. The modules 14 and 15 may be connected together, in series or parallel, and operated by a single power supply.

Overlying modules 14 and 15 is a pad 16 made of a material having high thermal conductivity, such as copper, to distribute heat evenly over the entire pad. Heat from pad 16 can then be uniformly transferred by modules 14 and 15 downward during the cooling operation or upward during the heating operation of the chip. In the embodiment shown, the dimensions of pad 16 are approximately $4.5 \times 8 \times 0.5$ cm. A thermocouple $TC_2$ is inserted in pad 16 through a hole drilled therein as shown in FIG. 1 to monitor the heat flow across the pad. The pad 16 is rigidly fastened to the thermal block 10 by means of screws 17A and 17B (FIG. 2) and securely holds the modules 14 and 15 against the block 10 to eliminate any vibrations.

The combination of the thermoelectric modules 14 and 15 and the pad 16 constitutes the first stage of a two-stage heat pumping mechanism of this invention and will hereinafter be referred to by this name.

To insure good thermal contact between the thermoelectric modules 14 and 15 and the block 10, a thin coating of a heat conductive compound such as zinc oxide crystals in silicon grease is applied to the lower faceplates 14B and 15B of modules 14 and 15, respectively. Similarly, to insure good thermal contact between the modules 14 and 15 and the pad 16, the upper faceplates 14A and 15A of modules 14 and 15, respectively, are coated with the just-mentioned heat conductive compound.

Arranged atop pad 16, in a central portion thereof, is another thermoelectric module 18. In the exemplary embodiment shown, module 18 is of the same type and size as modules 14 and 15 and has an upper faceplate 18A and a lower faceplate 18B embedded between which are a number of Peltier couples 18C. Module 18 is connected to a power supply (not shown) to enable it to function as a heat pump. The upper and lower faceplates 18A and 18B, respectively, of module 18 are coated with a thin layer of the heat conductive compound discussed above in connection with the modules 14 and 15, to enhance thermal contact between the lower faceplate 18B and the pad 16 and the upper faceplate 18A and the block 20.

Block 20 overlies the thermoelectric module 18 and is affixed to pad 16, securing the module 18 against the pad 16, by means of screws 19A and 19B (FIG. 2). Block 20 is made of a high thermal conductivity material, such as copper, and has a configuration as shown in FIG. 1 to receive an I.C. chip socket 22 having a rectangular cavity therein, and a flat contact area 21 for the I.C. chip to make uniform contact with. A thermocouple $TC_3$ is mounted in a hole drilled in block 20 to measure accurately the temperature of the I.C. chip resting on the contact area 21 within socket 22. The configuration of block 20 is specially designed to insure that socket 22 will be received with zero insertion force and, when the apparatus is assembled, will not vibrate. Another design feature of block 20 is that the contact area 21 is chosen to be as large as needed to match the particular I.C. chip to be tested. Also, since block 20 is rigidly mounted, during the probing operation, the block 20 will not allow the socket to move as a result of stresses introduced into the socket by the probe tips.

The combination of the thermoelectric module 18 and block 20 comprise the second stage of the two-stage heat pumping mechanism of this invention, and will be referred to by this name hereinafter.

The socket 22 is a commonly available insulating socket of a size and configuration and having pin holes 22A to receive a 24, 28, 40 or 64 pin chip 60 with zero insertion force. Socket 22 may be provided with a mechanical latch (not shown) for rigid attachment of the socket 22 to the block 20. Alternatively, socket 22 may be fastened to block 20 by screws 23A and 23B (FIG. 2). Attached to socket 22 is a cable 40 consisting of wires connecting to each of the socket pins.

The bottom cover plate 24 is made of a thermally insulating material such as plexiglass, and is attached to the thermal block 10 by screws 25A and 25B (FIG. 2) to thermally seal cavity 12 and minimize convective currents due to the flow of gases from the outside which deleteriously affect the heat pumping process. Additionally, the empty space of cavity 12 may be filled with a thermally insulative material, such as styrofoam, for a more efficient heat pumping process. Cover plate 24 is provided with a rectangular slot 26 (FIG. 1) to permit the upper portion of block 20 to pass therethrough as shown in FIG. 2.

The top cover plate 27, which is also made of a thermally insulative material like plate 24, is attached to the thermal block 10 by screws 28A and 28B such that the separation between plates 24 and 27 is approximately one-half inch. Cover plate 27 is provided with a slot for inserting/removing the I.C. chip 60 as shown in FIG. 2. The edges 29 of this slot are sloped inward (bottom-to-top) to direct the flow of dry nitrogen gas, introduced through the gas inlet 30 of block 10, toward the top of the I.C. chip area. By forcing dry nitrogen gas in the chamber 50 between the bottom cover plate 24 and the top cover plate 27 and the region where the I.C. chip 60 is inserted detrimental condensation of water vapor on the chip during the cooling operation is avoided.

As shown in FIG. 1, the thermal block 10 is provided with hole 31 to receive the cable 40, holes 32 and 33 to receive the appropriate pair of wires 14D, 14E, 15D or 15E from the serially/parallely connected thermoelectric modules 14 and 15, holes 34 and 35 to receive wires 18D and 18E from the thermoelectric module 18, and holes 36–38 to receive the thermocouples $TC_1$, $TC_2$ and $TC_3$, respectively. Cable 40 is electrically connected to appropriate external electrical I.C. chip testing devices (not shown). Thermocouples $TC_1$, $TC_2$ and $TC_3$ are connected to suitable temperature recorders. The wires emerging from holes 32–35 are connected to suitable D.C. power supplies to activate the thermoelectric modules 14, 15 and 18.

MODE OF OPERATION

The operation of the apparatus will be described in two parts: (1) the cooling operation, and (2) the heating operation.

COOLING OPERATION

The cooling operation will now be explained with reference to the assembled device shown in FIG. 2. The I.C. chip 60 to be cooled is inserted into socket 22 so that the metal bar on the chip is flush against the contact area 21 of the block 20. Dry nitrogen gas is then introduced through the inlet 30, maintaining a positive gas pressure inside the chamber 50. The power supplies which activate modules 18, 14 and 15 are turned on, causing currents to flow in all the modules in a direction such that heat will be pumped from the I.C. chip 60 to the thermal block 10 (which in this particular operation functions as a heat sink).

The performance characteristics of the first and second stage thermoelectric modules are a function of such module parameters as the operative current, the base temperature of the module, and the coefficient of performance. For example, using Melcor CP1.4-71-06 modules at room temperature and a voltage of 6 volts causing a current flow of 2.5 amps through each module, the rate of heat transferred by the modules will be about 17 watts and the temperature differential between the upper and lower faceplates of each module will be about 20° C.

The second stage thermoelectric module 18 will absorb heat from the I.C. chip 60 via the block 20 at the upper end of the module and reject heat at the lower end of the module to the pad 16. This rejected heat, due to the high thermal conductivity of pad 16, will be readily distributed uniformly throughout pad 16, thereby raising the temperature of pad 16. The first stage thermoelectric modules 14 and 15 will, in turn, absorb heat from pad 16 and transfer it to the sink 10. By means of thermocouples $TC_1$, $TC_2$ and $TC_3$, the temperatures of the heat sink 10, the pad 16 and the block 20 are monitored. Using these temperatures, the operating currents of the thermoelectric modules 14, 15 and 18 are adjusted by means of suitable current regulators (not shown) to the optimum values thereby maximizing the efficiency of this two-stage heat-pumping mechanism.

As a result of this heat transfer mechanism and since the I.C. chip 60 generally has a small thermal inertia and the sink 10 has a large heat-absorption capacity, the chip will cool rapidly well below the ambient typically in a minute or two. If the heat load of the I.C. chip 60 is high, i.e., the chip is powered, due to the load's thermal inertia it will, of course, take a longer time to cool the chip.

Also, when the heat load of the chip is high, the sink 10 may require external cooling to dissipate heat therefrom. This may be accomplished by circulating air around the block 10 or by immersing the block 10 in a cold liquid bath. Alternatively, the sink 10 may be cooled by forming cooling channels therein and forcing a coolant through these channels. By using this two-stage heat-pumping action, the I.C. chip may be cooled to a temperature of about $-55°$ C.

HEATING OPERATION

In this mode of operation, the thermal block 10 functions as a reservoir/source of heat which is transferred to the I.C. chip 60, thereby rapidly heating the chip. To heat the I.C. chip 60 mounted on socket 22, the currents in the various thermoelectric modules are reversed by reversing, for example, the polarities. The operating currents of the first and second stage thermoelectric modules are adjusted to obtain optimal heat transfer. Heat from source 10 is pumped upward by the first stage thermoelectric modules 14 and 15 to pad 16 where it is quickly and uniformly distributed. The second stage thermoelectric module 18 will, in turn, transfer heat from pad 16 to the block 20. Block 20 quickly conducts heat to the I.C. chip 60 in contact with the contact area 21, thereby heating the chip. In this mode of operation, temperatures of over 100° C. may be achieved in a very short time.

Using this invention in the manner described above, it is possible to rapidly heat or cool I.C. chips in a test socket in the wide temperature range of about $-55°$ C. to 105° C. to an accuracy of $\pm 1°$ C. without the problems of condensation of moisture on the chip and chip vibration characteristic of prior art methods. To obtain temperatures higher than about 105° C., the embodiment shown above may be modified by introducing a resistance heater element in the first stage, for example, inside pad 16. By directly heating pad 16 in this manner, heat from pad 16 can be rapidly transferred by the second stage of the heat pump to the I.C. chip 60, thereby raising the temperature of the chip to the desired value. Also, by increasing the number of stages of the heat pumping mechanism of this invention to, for example, four stages by means of a cascade of thermoelectric modules, the chip may be cooled to a temperature of about −75° C. and heated to about 120° C. or more.

While the invention has been illustrated and described with respect to a preferred embodiment thereof, it is to be understood that the invention is not limited to the precise construction herein disclosed and that right is reserved to all changes and modifications within the scope of the invention. An alternative embodiment, for example, may be a single stage heat pumping apparatus consisting of one or both of the thermoelectric modules 14 and 15 in direct contact with the block 20 (i.e. without the need for pad 16 and module 18).

Also, while the apparatus of this invention has been described with reference to heating/cooling an I.C. chip, this apparatus may be easily adapted to efficiently heat/cool electronic components, modules consisting of a group of electronic components and subassemblies. For all such applications, this apparatus has the versatility to provide a frost-free thermal environment localized at the test socket.

I claim:

1. An apparatus for selectively heating and cooling an I.C. chip comprising:
   a base formed of high thermal conductivity material and having a cavity for mounting the I.C. chip inside the cavity and selectively acting as one of a heat source or a heat sink, said cavity having a flat floor;
   a pair of primary thermoelectric modules having upper and lower faceplates, said lower faceplates being in thermal contact with said cavity floor;
   a heat conductive pad having upper and lower surfaces, the lower surface of said pad being in thermal contact with the upper faceplates of said primary thermoelectric modules;
   a secondary thermoelectric module having upper and lower faceplates, the lower faceplate of said secondary module being in thermal contact with the upper surface of said heat conductive pad;
   a heat conductive block having a base in thermal contact with the upper faceplate of said secondary thermoelectric module and an upwardly extending portion having a contact surface; and
   a slotted I.C. chip socket in integral relationship with the upwardly extending portion of said block such that, upon insertion into said socket, the chip is in thermal contact with said contact surface of the block.

2. The apparatus of claim 1 further comprising:
   a first thermocouple embedded in said cavity floor;
   a second thermocouple mounted inside said heat conductive pad at a central portion thereof;
   a third thermocouple mounted inside said heat conductive block proximate said contact surface;
   a bottom cavity cover plate having a slot for passing therethrough said upwardly extending portion of the block and thermally insulating said primary and secondary thermoelectric modules from convective currents;
   a top cavity cover plate having a slot for passing therethrough said chip, said top cover plate in conjunction with said bottom cavity cover plate forming a chamber around said socket; and
   a gas inlet in said base, in correspondence with said chamber for maintaining a positive gas pressure within said chamber.

3. The apparatus of claim 1 wherein the slot in said top cavity cover plate having walls sloped inward for directing the flow of said gas toward the chip.

4. The apparatus of claim 1 wherein said heat conductive pad is rigidly attached by screws to said cavity floor, said heat conductive block is rigidly attached by screws to said pad, said socket is rigidly attached by screws to said heat conductive block and said bottom and top cavity cover plates are rigidly attached by screws to said base.

5. A test socket for an I.C. chip comprising:
   a holder for releasably mounting said chip;
   a base formed of high thermal conductivity material for mounting the holder and for selectively acting as a heat sink or as a heat source;
   at least one thermoelectric module in direct contact with said base; and
   a heat conductive block having a base in thermal communication with said thermoelectric module and an upwardly extending portion having a contact surface for receiving said holder such that, upon mounting in said holder, the chip is in thermal communication with said contact surface of the block.

6. An apparatus for an I.C. chip comprising:
   a socket for releasably mounting said chip;
   a base formed of high thermal conductivity material for mounting the socket and for selectively acting as one of a heat sink or as a heat source;
   at least one primary thermoelectric module in thermal communication with said base;
   a heat conductive pad in thermal communication with said primary thermoelectric module;
   a secondary thermoelectric module in thermal communication with said heat conductive pad; and
   a heat conductive block having a base in thermal communication with said secondary thermoelectric module and an upwardly extending portion having a contact surface for receiving said socket such that, upon insertion in the socket, the chip is in thermal communication with the contact surface of the block.

* * * * *